United States Patent [19]
Gris

[11] Patent Number: 5,880,000
[45] Date of Patent: Mar. 9, 1999

[54] METHOD FOR FABRICATING AN NPN TRANSISTOR OF MINIMUM SURFACE

[75] Inventor: Yvon Gris, Tullins, France

[73] Assignee: SGS-Thomson Microelectronics S.A., Saint Genis, France

[21] Appl. No.: 969,996

[22] Filed: Nov. 13, 1997

[30] Foreign Application Priority Data

Nov. 19, 1996 [FR] France .................................. 96 14408

[51] Int. Cl.$^6$ ...................... H01L 21/331; H01L 21/8222
[52] U.S. Cl. ............................................................ 438/309
[58] Field of Search ................................. 438/309, 317, 438/341, 348, 350

[56] References Cited

U.S. PATENT DOCUMENTS 4,215,418  7/1980  Muramatsu .............................. 364/757
4,276,543  6/1981  Miller et al. ............................. 340/347
5,439,832  8/1995  Nakamura ................................ 437/31

*Primary Examiner*—Charles Bowers
*Assistant Examiner*—Craig Thompson
*Attorney, Agent, or Firm*—Wolf, Greenfield & Sacks, P.C.

[57] ABSTRACT

The present invention relates to an NPN transistor, the base and the emitter of which are formed within a window defined in a thick oxide according to a first substantially rectangular mask. At least a portion of the area defined by the first mask is covered with a polysilicon layer, preferably along a side of this first mask, a base contact area being formed under this polysilicon layer, the three other sides of the emitter-base area being delimited by a protection layer, an intrinsic base area, and then an emitter area covered with a doped N-type polysilicon layer, being formed in the opening thus defined.

18 Claims, 3 Drawing Sheets

METHOD FOR FABRICATING AN NPN TRANSISTOR OF MINIMUM SURFACE

BACKGROUND OF THE INVENTION

1. Field of the Invention

The present invention relates to the field of integrated circuits and more specifically to the fabrication of an NPN transistor.

2. Discussion of the Related Art

In patent application filed on even day herewith under attorney docket number S1022/7945 and incorporated herein by reference, a method for fabricating a bipolar transistor compatible with a BICMOS technology (that is, a technology enabling the simultaneous fabrication of bipolar transistors and of complementary MOS transistors) is described.

An example of NPN transistor obtained by using a BICMOS technology is shown in FIG. 12A of the above-mentioned patent application, which is reproduced in appended FIG. 1.

This NPN transistor is formed in an epitaxial layer 2 which is above a buried layer 3 formed in a P-type silicon substrate (not shown). The transistor is formed in a window made in a thick oxide layer 5. References 21 and 22 designate thin silicon oxide and silicon nitride layers which are used to protect other elements of the integrated circuit (such as CMOS transistors) during the fabrication of the bipolar transistor. Reference 23 designates a portion of a P-type doped polysilicon layer called base polysilicon since the base contact diffusion 32 is formed from this silicon layer. Polysilicon layer 23 is coated with an encapsulation silicon oxide layer 24. A central emitter-base opening is formed in layers 23 and 24 altogether. A thin silicon oxide layer 31 covers the sides of polysilicon layer 23 and the bottom of the opening. In this opening, an N-type high energy implant meant for forming a sub-collector region with a selected doping level is performed. The walls of the emitter-base opening are coated with a silicon nitride layer 44. Polysilicon lateral spacers 43 are formed on the sides of the opening. Before the forming of silicon nitride region 44 and of polysilicon spacers 43, an intrinsic base implant 33 is formed. After the spacers have been formed, a highly-doped N-type polysilicon layer 46 from which is formed emitter region 49 is deposited. Polysilicon layer 46 is coated with an encapsulation oxide layer 47. The general structure is coated with an insulating and planarizing layer 51 through which are formed emitter contact openings 55 joining polysilicon layer 46 and base contact openings 56 joining polysilicon layer 23. Further, a collector contact (not shown) is made via an N-type drive-in 30 towards buried layer 3.

This transistor has a circular symmetry, the emitter being centrally positioned and the base polysilicon being ring-shaped around this emitter.

SUMMARY OF THE INVENTION

An object of the present invention is to provide an NPN transistor of the same general type as that of FIG. 1 but the topology of which is modified so that it can have a minimum dimension.

Another object of the present invention is to provide an NPN transistor, the stray capacitances of which are reduced and which is thus likely to operate at high frequencies.

To achieve these and other objects, the present invention provides an NPN transistor, the base and the emitter of which are formed within a window defined in a thick oxide according to a first substantially rectangular mask. At least a portion of the area defined by the first mask is covered with a polysilicon layer, preferably along a side of this first mask; a base contact area is formed under this polysilicon layer; the three other sides of the emitter-base area are delimited by a protection layer, an intrinsic base area, and then an emitter area covered with an N-type doped polysilicon layer, being formed in the opening thus defined.

The present invention also provides a method for fabricating an NPN transistor in an N-type epitaxial layer including the steps of defining a window in a thick oxide layer, according to a first substantially rectangular mask; depositing a protection layer and suppressing it within an opening defined by a second mask generally internally to the first mask and extending beyond on one side thereof; depositing a first polysilicon layer and a silicon oxide layer and opening it within a contour defined by a third mask encompassing a common portion of the first two masks; performing an oxidizing thermal annealing; performing a P-type implant for the formation of the intrinsic base; depositing a silicon nitride layer and a second layer of polysilicon, etching the polysilicon layer anisotropically to only leave spacers along the sides of the opening defined by the third mask, and removing the silicon nitride layer where it is not protected by the spacers; performing a high energy N-type annealing to form a collector region; and depositing an N-type emitter polysilicon layer.

According to an embodiment of the present invention, the protection layer includes a layer of silicon oxide and a layer of silicon nitride.

These objects, characteristics and advantages as well as others, of the present invention, will be discussed in detail in the following non-limiting description of specific embodiments of the present invention, in relation with the accompanying drawings.

DETAILED DESCRIPTION

Figure 1:
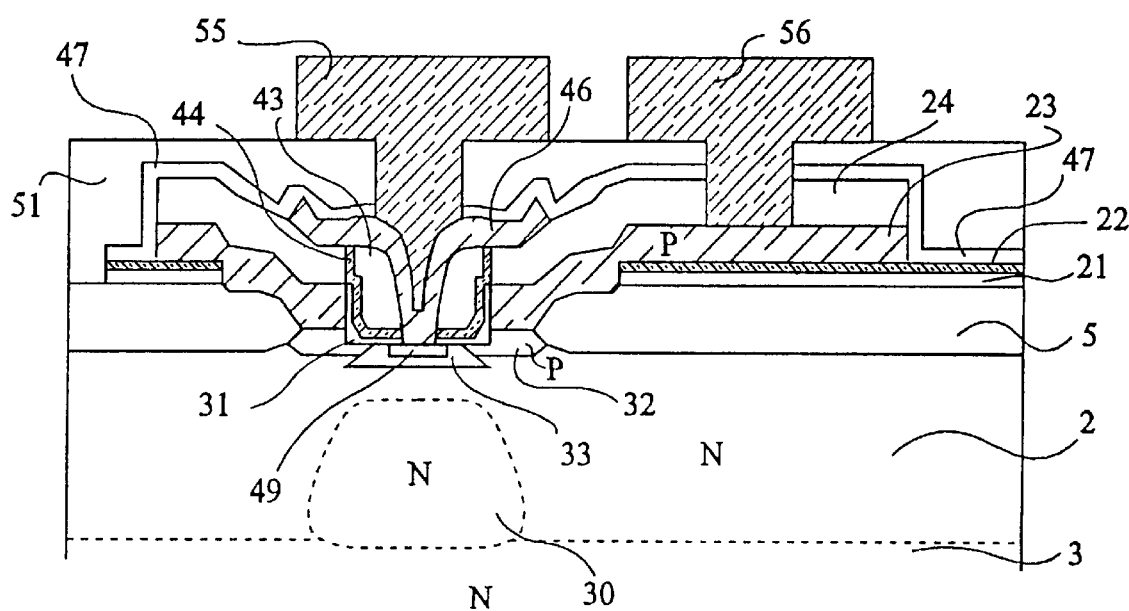
FIG. 1 shows an NPN transistor fabricated by a method described in the incorporated by reference patent application referred to above.
Figure 2A:
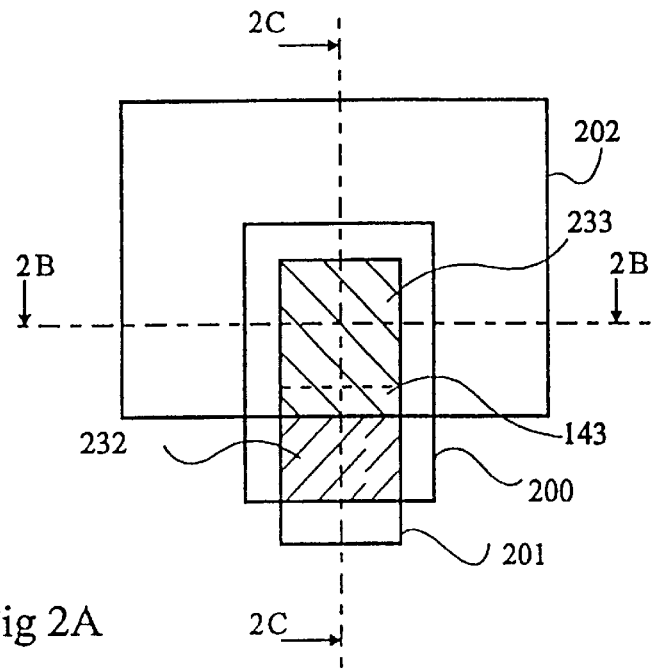
FIGS. 2A, 2B, 2C, respectively show a top view of a mask, and simplified cross-sectional views taken along lines 2B—2B and 2C—2C of FIG. 2A, of an example of a component according to the present invention at an intermediary stage of fabrication.
Figure 2B:
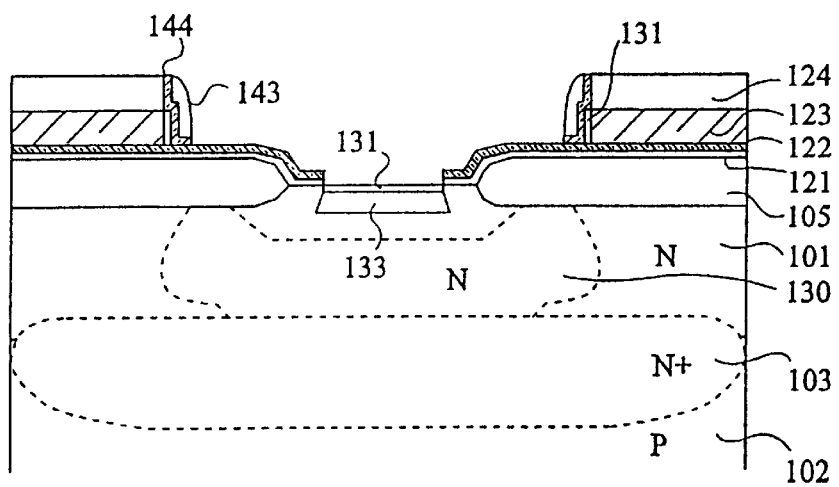
Figure 2C:
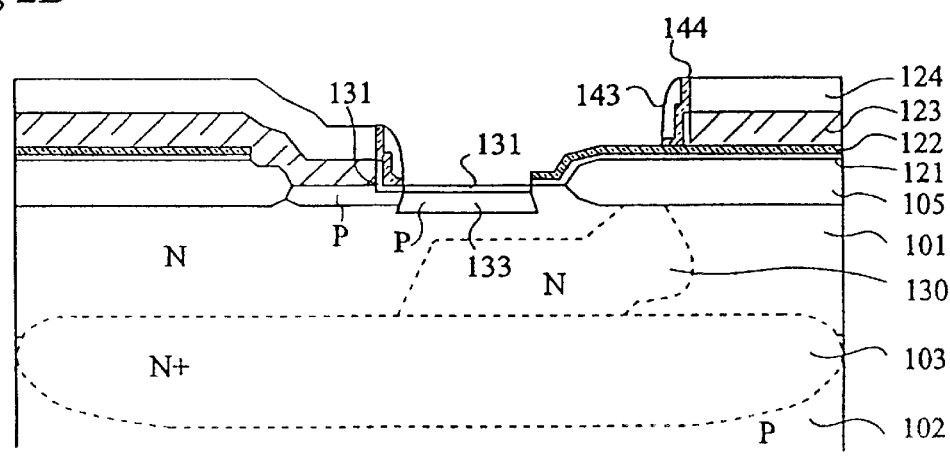

FIGS. 2A to 2C show an NPN transistor according to the present invention at intermediary stage of fabrication. The technological steps are substantially the same as those described in relation with FIG. 1, but the topology and the relative positions of the mask are different.

The NPN transistor is formed in an epitaxial layer 101 of type N formed on a P-type substrate 102, a highly-doped buried layer of type N (N$^+$) 103 being disposed under the active portions of the NPN transistor. The lateral insulation of the NPN transistors from one another and with respect to other elements of the integrated circuit is made by insulating walls formed of P-type diffusions extending across the entire width of epitaxial layer 101. The emitter-base structure is formed within a window defined by a mask of substantially rectangular shape 200 in a thick oxide layer 105.

A protection layer 121–122, for example, formed of a silicon oxide layer 121 and of a silicon nitride layer 122, is deposited on the structure. This protection layer is open according to the contour of a mask 201 also of substantially rectangular shape. As shown in FIG. 2A, mask 201 is disposed within three sides of mask 200 and extends beyond this mask 200 on the fourth side.

Then, a "base" polysilicon layer 123, P-type doped by implant after deposition, and an encapsulation silicon oxide layer 124 are successively deposited. An opening is formed in layers 123–124 according to the contour of a mask of substantially rectangular shape 202, three sides of which are external to the contours of masks 200 and 201, and the fourth side of which cuts masks 200 and 201. The portion of mask 202 extending beyond mask 200 is opposite to the portion of mask 201 extending beyond this mask 200. Thus, after etching, the P-type doped polysilicon layer 123 is in contact with the upper surface of epitaxied layer 101 in a portion which corresponds to hatched area 232 of FIG. 2A. Then, a thermal oxidation to oxide the apparent sides of layer 122 and the bottom of the opening on epitaxial layer 101 is performed. The remaining portion of this thermal oxidize layer after subsequent processings is designated in FIGS. 2B and 2C by reference 131. During this step, the P-type doping contained in polysilicon 123 diffuses in epitaxial layer 101 to form a base contact region 132, the contour of which substantially corresponds to above-mentioned area 232.

The following step includes an implant of a P-type doping meant for the formation of intrinsic base region 133. This intrinsic base is preferably implanted with low energy boron (for example, $10^{13}$ atoms/cm$^2$ under 5 keV). With this level of implant, the dopings can cross neither protection layer 121–122, nor, a fortiori, polysilicon layer 123 and silicon oxide layer 124 altogether. The implant is thus limited to an "intrinsic base opening" 233 defined by the intersection of masks 200 and 202. Preferably, this implant is implemented under oblique incidence (for example, under a 7° angle) to have the doping penetrate beyond the contour or edge of the opening.

The deposition of a silicon nitride layer and of a polysilicon layer is then performed. The polysilicon layer is etched anisotropically across its entire width, to only leave spacers 143 on the sides of the openings formed in layers 123 and 124. Then, the entire apparent surface of the silicon nitride layer just deposited is etched so that this silicon nitride layer remains in place only in portions 144 enclosed by spacers 143.

Figure 3A:
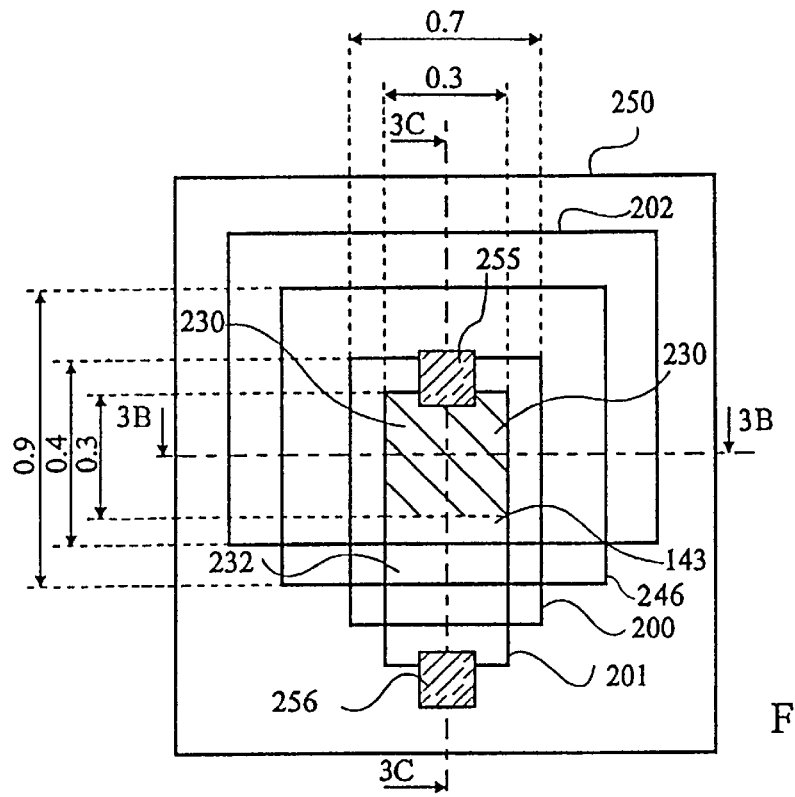
FIGS. 3A, 3B, 3C, respectively show a top view of a mask, and simplified cross-sectional views taken along lines 3B—3B and 3C—3C of FIG. 3A, of an example of a component according to the present invention at a further stage of fabrication.

By means of the above steps, a so-called "emitter opening" has been defined, the contour of which is designated by reference 230 in the top view of FIG. 3A. This opening is covered with thin silicon oxide layer 131 only, as can be seen in FIGS. 2B and 2C. The surface of this opening is defined by the intersection of masks 200 and 202 (intrinsic base opening), reduced on the side of the edge of mask 202 by the width of spacer 143.

Then, an implant of an N-type doping meant for defining the collector 130 of the NPN transistor is performed. This implant is implemented at medium dose and high energy (for example, $10^{12}$ to $10^{14}$ atoms/cm$^2$ under 500 keV). The result of this implant appears in FIGS. 2B and 2C. It should be noted that, due to the topology of the various previously etched layers, this implant extends under emitter opening 230, and beyond this opening but not under base contact region 132 which is masked by layers 123 and 124 altogether and spacer 143. An effective collector region 130 of limited lateral extent, substantially equal to that of the intrinsic base, is thus obtained. This contributes to the obtaining of an NPN transistor of low stray capacitance between collector and extrinsic base. The implant is optimized (for example, by successive implants) so that the collector contour provides the best possible compromise between, on the one hand, the collector resistance and the time of transit through this collector and, on the other hand, the obtaining of sufficiently high emitter-collector (typically 4 volts) and base-collector breakdown voltages and of a low base-collector capacitance. It should also be noted that this collector implant enables to previously choose an epitaxial layer 2 having a doping and a thickness adequate for optimizing CMOS transistors formed on the same chip and then to independently optimize the characteristics of the NPN transistor. Especially, epitaxial layer 101 can be thicker than if it had to be directly used as a collector layer of the NPN transistor.

Figure 3B:
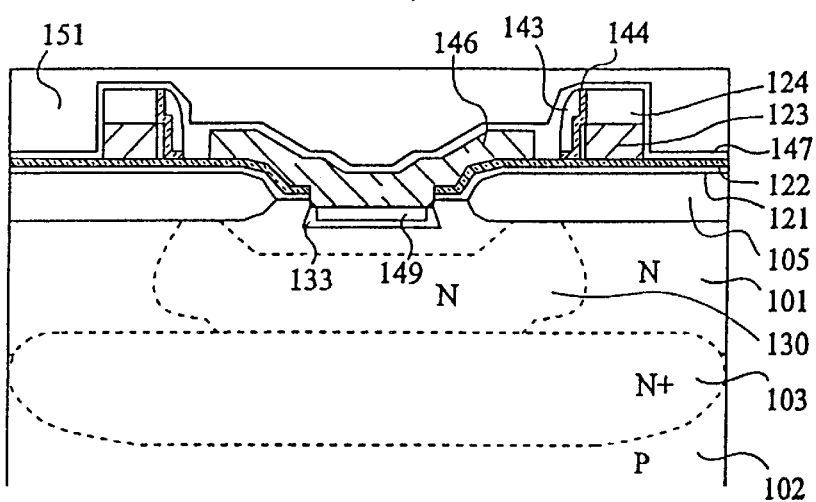
Figure 3C:
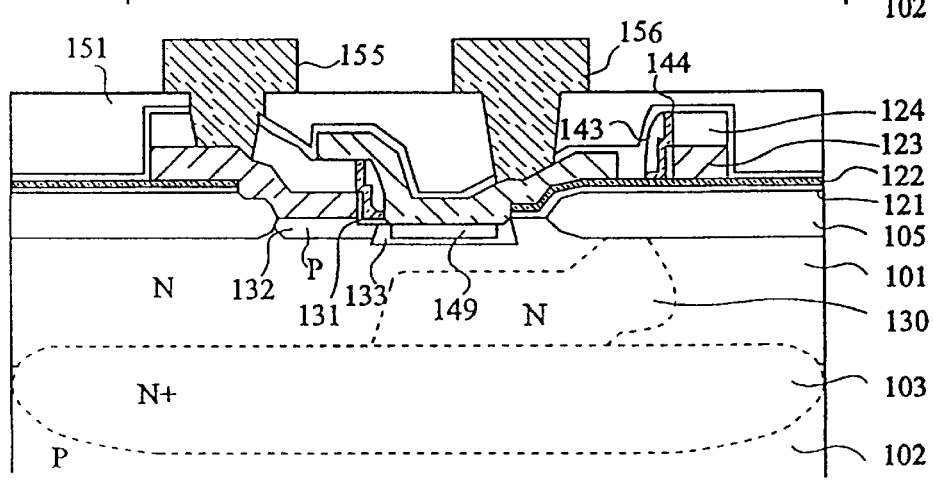

As shown in FIGS. 3A to 3C, the deposition of an N-type doped polysilicon layer 146 which is maintained in place according to the contour of a mask 246 which ensures that this layer is present at least above emitter opening 230 and extends below this opening to enable to subsequently make contacts is performed. An emitter region 149 is formed from the dopings contained in N-type doped polysilicon layer 146.

After the formation and the cutting-up of polysilicon layer 146, layers 123 and 124 altogether are defined somewhat widely above the thick oxide layer by a mask 250, the contour of which surrounds those of all the previously mentioned masks.

Then, the deposition of a layer of a planarizing insulating product 151 is performed, and openings are formed in this layer and the underlying layers, according to contact masks 255 and 256 for forming emitter and base contacts 155 and 156, respectively in contact with polysilicon layer 146 and with polysilicon layer 123.

Although it has not been shown in the drawings, it should be clear that buried layer 3 will be continued on one side or the other of the structure to contact an N-type well enabling to resume collector contact, as usual.

The use of this technique and of this topology enables obtaining an NPN transistor of minimum dimension. Indeed, in a fabrication line where the minimum dimension of an opening in a mask is 0.3 μm, dimensions of 0.7×0.9 μm can be chosen for mask 201, and a width (in the direction where mask 200 has a dimension of 0.7 μm) of 0.3 μm. Thus, the hatched area designated by reference 230 of effective emitter contact can have dimensions of around 0.3×0.3 μm, that is, the effective emitter opening has a surface area of around 0.1 μm$^2$.

It should be noted that emitter mask 230 is surrounded on three sides with intrinsic base mask 233. The base diffusion must thus have a greater extent under the mask than the emitter diffusion. This occurs for several reasons:
— the base is preferably implanted under oblique incidence;
— boron diffuses laterally more than arsenic;
— the base results from an implant followed by a diffusion annealing in a furnace whereas the emitter results from a solid-solid diffusion due to a fast thermal annealing.

In addition to the fact that it occupies a particularly small silicon surface area, the transistor according to the present invention has many advantages.

In a structure of conventional design, with an annular base and a central emitter, and of critical dimensions, the emitter surface area or effective surface area (contact area between the polysilicon and the monosilicon) is of around 0.2 m$^2$ and the active surface area (surface area of the opening in the thick oxide) is 2 $\mu$m$^2$. Thus, the (effective surface)/(active surface) ratio is around 0.2/2=0.1. With the provided technology, the emitter surface is 0.1 $\mu$m$^2$ and the effective surface is 0.2 m$^2$. The (effective surface)/(active surface) ratio becomes 0.1/0.2=0.5. The provided technology is thus much more efficient.

Further, the effective surface decreases from 0.2 to 0.1 $\mu$m$^2$. The surface of the intrinsic transistor is thus decreased by a factor 2. As a result, the transistor will have a same frequency of transition for a current 2 which is twice as small and will thus have a reduced consumption.

Finally, the parasitic portions of the transistor decrease from 1.7 to 0.1 $\mu^2$. In particular, the extrinsic base-collector capacitance will be reduced by this amount.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for fabricating an NPN transistor in an N-type epitaxial layer including the steps of:
   defining a window in a thick oxide layer, according to a first substantially rectangular mask,
   depositing a protection layer and suppressing it within an opening defined by a second mask generally internally to the first mask and extending beyond one side thereof,
   depositing a first polysilicon layer and a silicon oxide layer and opening it within a contour defined by a third mask encompassing a common portion of the first two masks,
   performing an oxidizing thermal annealing,
   performing a P-type implant for the formation of the intrinsic base,
   depositing a silicon nitride layer and a second layer of polysilicon, etching the polysilicon layer anisotropically to only leave spacers along the sides of the opening defined by the third mask, and removing the silicon nitride layer where it is not protected by the spacers,
   performing a high energy N-type annealing to form a collector region, and
   depositing an N-type emitter polysilicon layer.

2. A method according to claim 1, wherein the protection layer includes a layer of silicon oxide and a layer of silicon nitride.

3. A method of fabricating a transistor in an epitaxial layer, comprising the steps of:
   defining a window in a thick oxide layer, according to a first substantially rectangular mask;
   depositing a protection layer and suppressing the protection layer within an opening defined by a second mask disposed internally to the first mask and extending beyond one side thereof;
   depositing at least a first polysilicon layer and opening said first polysilicon layer within a contour defined by a third mask that encompasses a common portion of the first two masks;
   performing an implant for the formation of the intrinsic base;
   performing a high energy annealing to form a collector region; and
   depositing an emitter polysilicon layer.

4. A method according to claim 3 wherein said method is for fabricating an NPN transistor in an N-type epitaxial layer.

5. A method according to claim 4 wherein the step of depositing at least a first polysilicon layer includes also depositing a silicon oxide layer.

6. A method according to claim 5 including performing an oxidizing thermal annealing step after the step of depositing at least a first polysilicon layer.

7. A method according to claim 6 wherein the step of performing an implant comprises performing a P-type implant.

8. A method according to claim 7 including after the step of performing an implant, depositing a silicon nitride layer and a second layer of polysilicon, etching the second polysilicon layer anisotropically to only leave spacers along the sides of the opening defined by the third mask, and removing the silicon nitride layer where it is not protected by the spacers.

9. A method according to claim 8 wherein the step of performing a high energy annealing includes performing a high energy N-type annealing.

10. A method according to claim 9 wherein the step of depositing an emitter includes depositing an N-type emitter polysilicon layer.

11. A method of fabricating a transistor in an epitaxial layer, comprising the steps of:
    defining a window in a thick oxide layer;
    depositing a protection layer;
    depositing at least a first polysilicon layer to define an opening;
    performing an oxidizing thermal annealing;
    performing an implant for the formation of the intrinsic base;
    depositing a silicon nitride layer and a second layer of polysilicon;
    etching the second polysilicon layer anisotropically to leave only spacers along sides of the opening;
    removing the silicon nitride layer where it is not protected by said spacers;
    performing a high energy annealing to form a collector region; and
    depositing an emitter polysilicon layer.

12. A method according to claim 11 wherein said method is for fabricating an NPN transistor in an N-type epitaxial layer.

13. A method according to claim 11, wherein the step of performing an implant comprises performing a P-type implant.

14. A method according to claim 11, wherein the step of performing a high energy annealing includes performing a high energy N-type annealing.

15. A method according to claim 14, wherein the step of depositing an emitter includes depositing an N-type emitter polysilicon layer.

16. A method according to claim 11 wherein the step of defining a window employs a first substantially rectangular mask.

17. A method according to claim 16 wherein the step of depositing a protection layer includes suppressing the layer within an opening defined by a second mask disposed internally to the first mask and extending beyond one side thereof.

18. A method according to claim 17 wherein the step of depositing at least a first polysilicon includes depositing also a silicon oxide layer and opening it within a contour defined by a third mask that encompasses a common portion of the first two masks.

* * * * *